United States Patent
Teramae et al.

(10) Patent No.: US 7,023,027 B2
(45) Date of Patent: Apr. 4, 2006

(54) DIODE PACKAGE HAVING AN ANODE AND A CATHODE FORMED ON ONE SURFACE OF A DIODE CHIP

(75) Inventors: Toshiya Teramae, Ebina (JP); Junichi Saeki, Yokohama (JP); Yasuharu Ichinose, Ryuo (JP); Shuichi Suzuki, Ichikawadaimon (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/294,619

(22) Filed: Nov. 15, 2002

(65) Prior Publication Data
US 2003/0094621 A1 May 22, 2003

(30) Foreign Application Priority Data
Nov. 22, 2001 (JP) .............................. 2001-357775

(51) Int. Cl.
*H01L 29/861* (2006.01)
*H01L 29/88* (2006.01)
(52) U.S. Cl. .................... 257/104; 257/281; 257/620
(58) Field of Classification Search ................ 257/620, 257/622, 737, 104, 281, 544; 438/462
See application file for complete search history.

(56) References Cited

U.S. PATENT DOCUMENTS

| | | | | |
|---|---|---|---|---|
| 5,393,711 | A | * | 2/1995 | Biallas et al. ................ 438/458 |
| 6,060,768 | A | | 5/2000 | Hayashida et al. |
| 6,507,092 | B1 | | 1/2003 | Fukasawa et al. |
| 6,607,970 | B1 | * | 8/2003 | Wakabayashi ............... 438/462 |
| 6,635,962 | B1 | * | 10/2003 | Shibata et al. ............... 257/737 |
| 6,780,746 | B1 | * | 8/2004 | Kinsman et al. ............ 438/612 |

FOREIGN PATENT DOCUMENTS

| | | |
|---|---|---|
| JP | 05-062980 | 3/1993 |
| JP | 05-326618 | 12/1993 |
| JP | 08-162455 | 6/1998 |
| JP | 11-162889 | 6/1999 |
| JP | 11-214434 | 8/1999 |
| JP | 2001-284497 | 10/2001 |

\* cited by examiner

*Primary Examiner*—Phat X. Cao
(74) *Attorney, Agent, or Firm*—Antonelli, Terry, Stout and Kraus, LLP.

(57) ABSTRACT

A small semiconductor package having two electrodes, which can be produced at reduced cost and which features high reliability. The package has a structure in which an anode and a cathode are arranged on one surface of a semiconductor chip, each electrode having a bump electrode for connecting the electrode to an external substrate. An insulating resin is provided on the surface of the semiconductor chip and on the surfaces of the bump electrodes, except at least for the connection portions to the external substrate.

6 Claims, 20 Drawing Sheets

(a)

(b)

(a)

(b)

(c)

(d)

(e)

DIODE PACKAGE HAVING AN ANODE AND A CATHODE FORMED ON ONE SURFACE OF A DIODE CHIP

BACKGROUND OF THE INVENTION

The present invention relates to a semiconductor package having an anode and a cathode. As an example, FIGS. 1 and 2 illustrate a conventional diode package 1 in the form of a semiconductor package having two electrodes, i.e., an anode and a cathode. FIG. 1 is a diagrammatic perspective view, and FIG. 2 is a partial sectional view thereof.

In FIG. 1, two lead frames 2 and 3 are arranged on nearly the same axis; a semiconductor chip 4 is bonded onto the surface of the one lead frame 2 by a eutectic junction or press adhesion; a gold wire 5 is connected at one end to the surface of the semiconductor chip 4; and the surface of the semiconductor chip 4 is electrically connected to the other lead frame 3 through the gold wire 5. The semiconductor chip 4, gold wire 5 and lead frames 2, 3 are molded with a resin 6, which has a nearly rectangular parallelopiped outer shape.

An electric current flows between the lead frames 2 and 3 in the direction of the thickness of the semiconductor chip 4. The diode package 1 has a size measuring, as the outer shape of the resin 6, about 1.0 mm long, about 0.6 mm wide and about 0.55 mm high. The semiconductor chip 4 embedded in the resin 6 measures 0.3 mm long, about 0.3 mm wide and about 0.15 mm high.

JP-A-8-306853 discloses a semiconductor package having a package size that is larger than the diode package and having three or more electrodes, i.e., having a structure in which many electrode pads and many leads are formed on the surface of a semiconductor chip. In this package, the electrode pads and the leads are connected together through wires; bump electrodes are formed on the portions of the leads; and the surfaces of the leads and the side surfaces of the semiconductor chip are sealed with a resin in such a way that the ends and side surfaces of the bump electrodes and the back surface of the semiconductor chip are exposed.

SUMMARY OF THE INVENTION

With the trend toward realizing electronic devices that are small in size and of reduced weight, however, modules constituting electronic devices have been fabricated to have a small size. In addition, electronic parts, such as the diode package 1 constituting the modules, also have been designed to have a small size and to have a small height. In order to decrease the size and height of the diode package 1, the package size must be decreased. In the conventional diode package 1 shown in FIGS. 1 and 2, the semiconductor chip 4 is formed on the lead frame 2 in a state where it is raised above the bottom surface of the package and is connected to the other lead frame 3 by bonding the gold wire 5 thereto. Therefore, a limitation is imposed on reducing the height (thickness) of the package. In this conventional structure, even if an attempt is made to greatly decrease the size of the semiconductor chip 4 or the lead frame in order to reduce the size of the package, the ratio at which they occupy the volume of the resin 6 decreases. Therefore, the occurrence of cracks of even a slight degree in the resin 6 could become a fatal defect. Even with a production process having the type of sealing which uses the resin described in the above-mentioned publication, a limitation is imposed on decreasing the size of the package, and so it becomes necessary to change the structure of the package. In general, however, a change in the structure of the package is accompanied by an increase in the cost, although a package structure which suppresses the cost is desired. Further, when an attempt is made to decrease the size of the semiconductor package, defects tend to occur at an increased frequency during production, necessitating a technology for guaranteeing a high degree of reliability.

In view of the above circumstances, which are inherent in the related art, it is an object of this invention to realize a small semiconductor package structure having a two-electrode constitution, such as a diode package, in which an increase in the cost is suppressed and high reliability is maintained.

This invention provides technology capable of satisfying the above-described object.

In order to satisfy the above-described object, this invention provides a semiconductor package having two electrodes, including anode and a cathode. The package has a structure in which the anode and the cathode are arranged on one surface of the chip, each electrode having a bump electrode for connecting the electrode to an external substrate, and an insulating resin is provided on the surfaces of the bump electrodes, except at least at the connection portions to the external substrate and on the surfaces of the semiconductor chip. The surfaces of the chip may include side surfaces of the chip formed to surround the flat surface on which the anode and the cathode are arranged.

As a method of manufacturing the package, a semiconductor wafer is produced comprising a plurality of semiconductor chips having two electrodes in the form of an anode and a cathode arranged on a first surface of the chip and having bump electrodes formed on these two electrodes. A groove is formed among the semiconductor chips on the semiconductor wafer; the chip surface and the surfaces of bump electrodes are covered with an insulating resin, while filling the resin in the grooves; and the insulating resin is removed from the portions where the surfaces of the bump electrodes are connected to the external substrate. Then, after the insulating resin is cured, the semiconductor wafer is cut along the grooves and is separated into individual semiconductor chips.

As a further method of manufacturing the package, the semiconductor wafer is produced in the same manner as described above; a second flat surface of the semiconductor wafer on the side opposite to the first surface is secured to a first dicing sheet for securing the wafer; and a groove is formed among the semiconductor chips. Then, the semiconductor chips are separated from each other, and they are secured on the side of the end surfaces of the bump electrodes to a second dicing sheet having a stickiness that is stronger than that of the first dicing sheet. Thereafter, the first dicing sheet is removed from the second surface, the insulating resin is filled in the grooves, and the surfaces of the bump electrodes and the surfaces inclusive of the second surfaces of the semiconductor chips are covered with the insulating resin, which is, then, cured. Thereafter, the semiconductor wafer is cut and separated into individual semiconductor chips in a state where the insulating resin in the grooves is left on the side surfaces thereof, and the second dicing sheet is removed from the side of the ends of the bump electrodes.

DETAILED DESCRIPTION OF THE PREFERRED EMBODIMENT

An embodiment of the invention will now be described with reference to the drawings. This embodiment is directed to a diode package, as an example.

Figure 1:
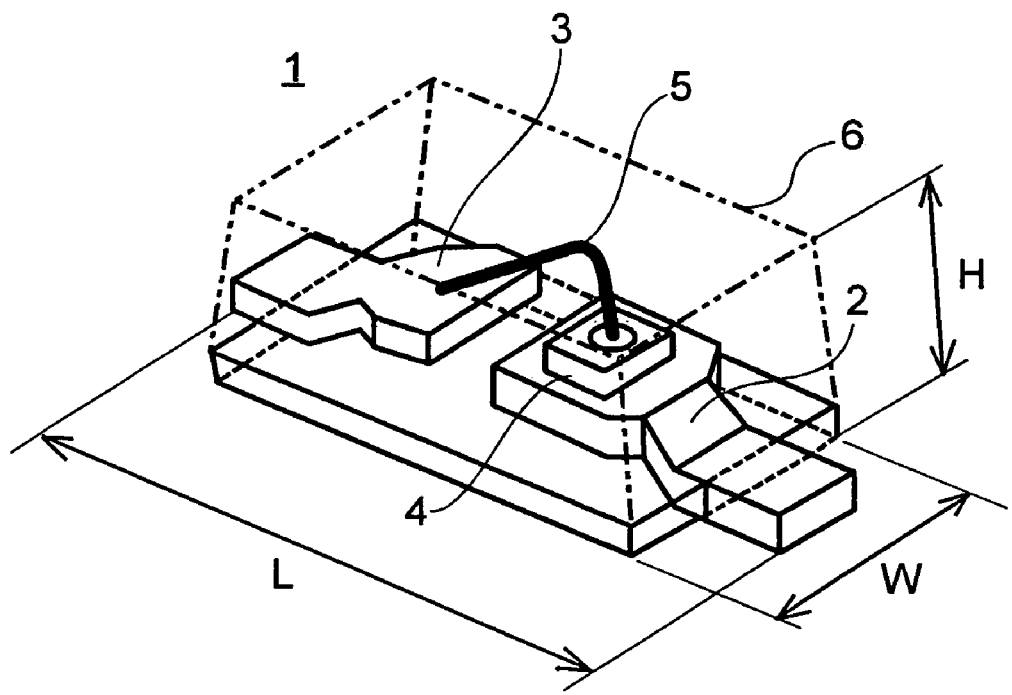
FIG. 1 is a diagrammatic perspective view schematically illustrating a conventional diode package.
Figure 2:
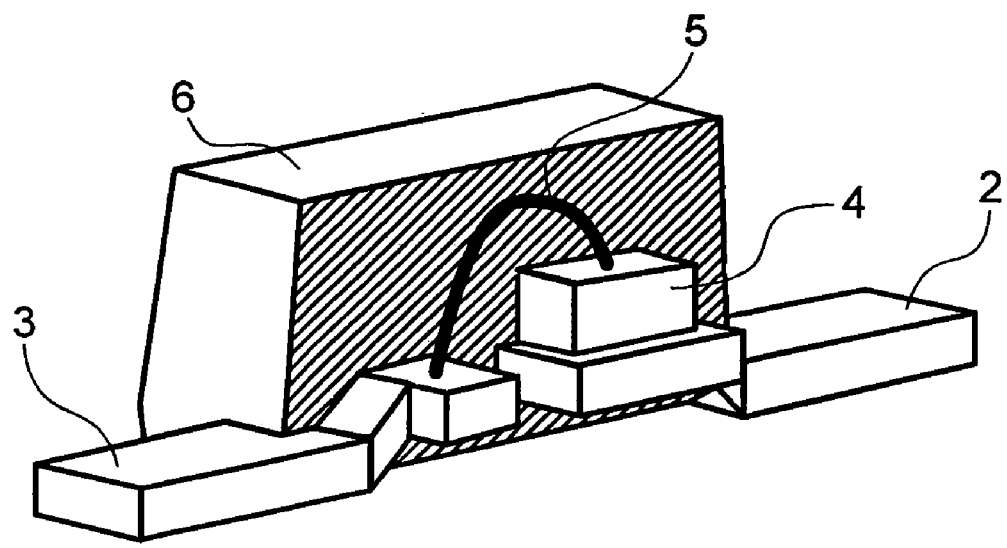
FIG. 2 is a partial sectional view of the diode package of FIG. 1.
Figure 3:
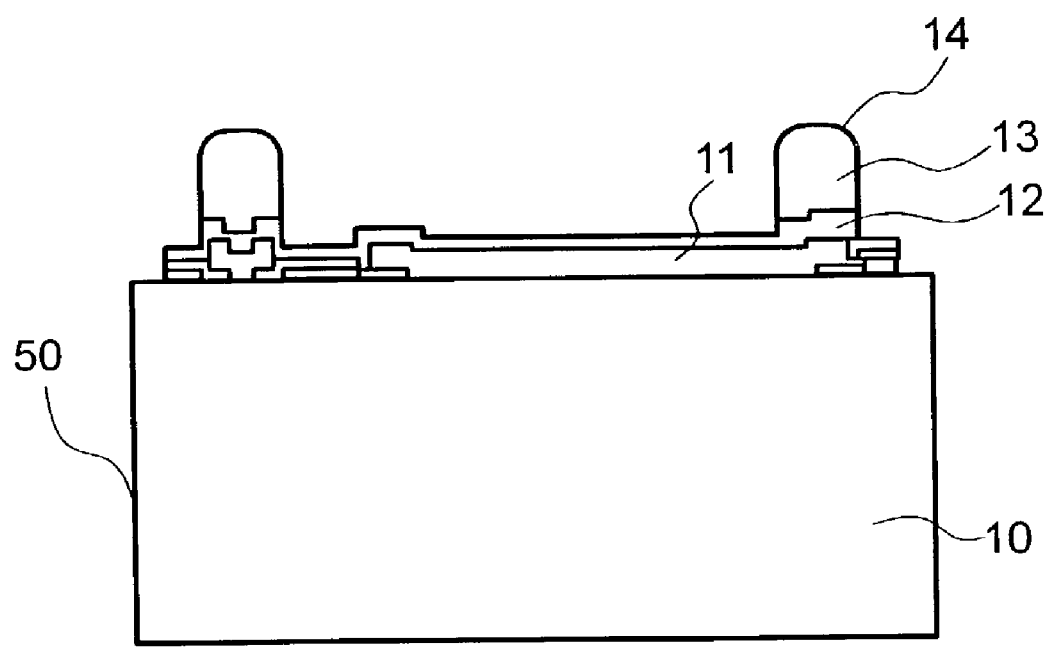
FIG. 3 is a side view of a diode package of the bare chip type.

FIG. 3 illustrates the structure of a diode package 50 of the bare chip type. This diode package 50 has a so-called lateral structure in which two electrodes, including an anode and a cathode, are formed on the front surface side of the semiconductor chip 10. An electrode 11 is formed on the surface of the semiconductor chip 10; an under bump metal member 12 is deposited thereon by, for example, sputtering; and a bump electrode 13 is formed by, for example, plating on the metal member 12 to electrically connect the anode and the cathode to an external substrate. Here, to suppress oxidation of the bump electrode 13, a metal layer 14 is plated on the surface of the bump electrode 13 for suppressing such oxidation. When the connection to the external substrate is accomplished by soldering (solder junction), the bump electrode 13 is chiefly composed of copper or nickel, and gold is plated as the metal member 14 to suppress the oxidation of the bump electrode 13. The bump electrode 13 has a height of about 20 to 25 µm. Employment of such a lateral structure makes it possible to lower the height of the package (decrease the height), which, incidentally, enables the thickness of the modules and electronic devices to be decreased.

Figure 4:
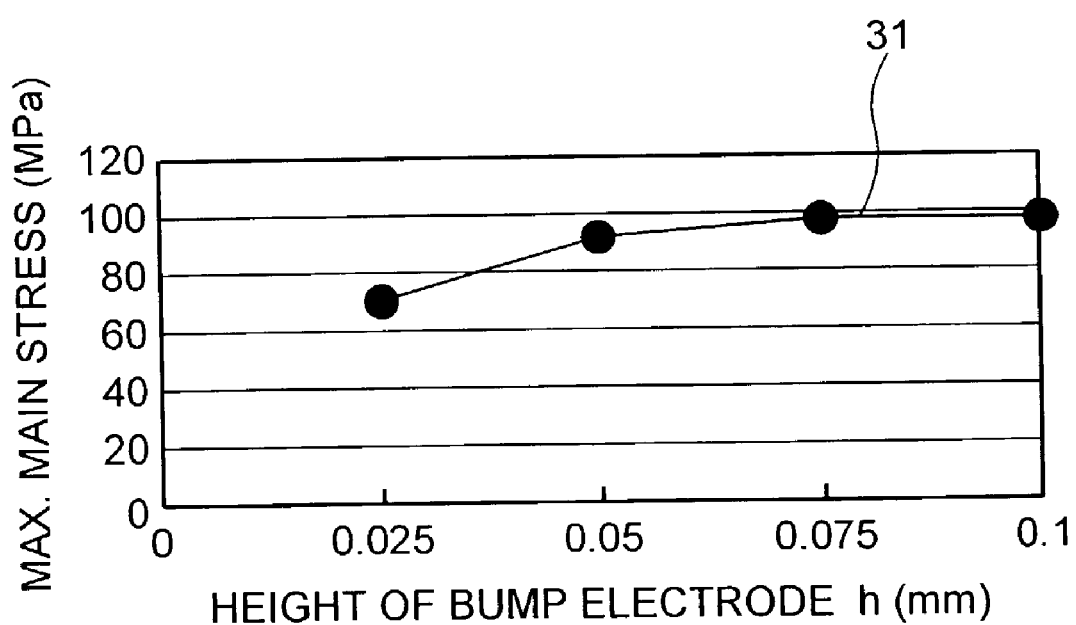
FIG. 4 is a graph illustrating the effect of the height of a bump electrode upon the stress in the interface between a semiconductor chip and the bump electrode.

FIG. 4 is a graph illustrating a relationship between the height of the bump electrode and the maximum stress occurring in the interface between the semiconductor chip 10 and the bump electrode 13 in the step of reflowing the solder for joining the diode package 50 to the external substrate 16 with the solder. FIG. 4 indicates that the maximum stress increases with an increase in the height of the bump electrode 13, and, with increased stress, cracks tend to occur in the semiconductor chip 10.

Figure 5:
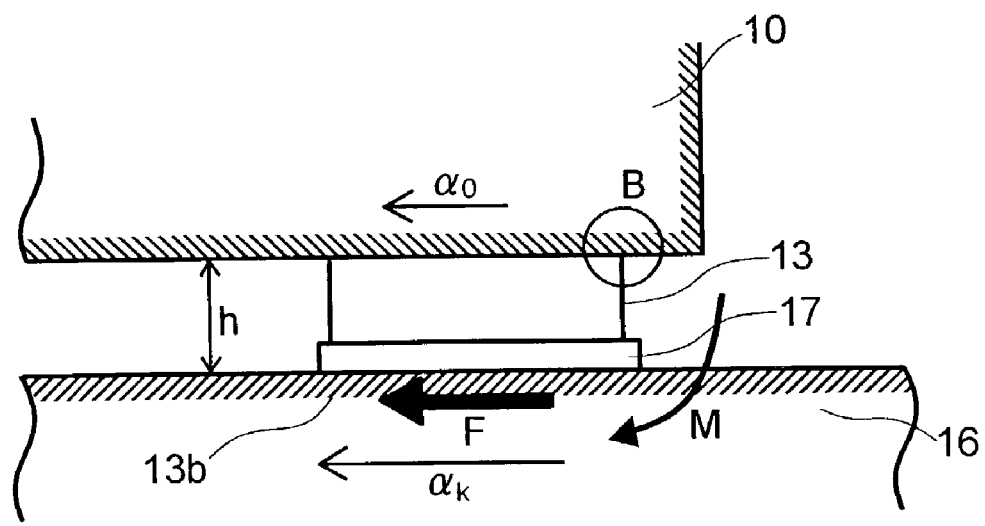
FIG. 5 is a diagram illustrating, on an enlarged scale, the vicinity of the bump electrode at the time of reflowing of the solder.

FIG. 5 is a diagram illustrating, on an enlarged scale, the vicinity of the bump electrode 13. In FIG. 5, a shearing force F occurs at the end 13b of the bump electrode 13 due to a difference between the coefficient of expansion ac of the semiconductor chip 10 and the coefficient of expansion ak of the external substrate 16. A bending moment M occurs in the bump electrode 13 due to the shearing force F and the height of the bump electrode 13, and a stress σ builds up in the interface B between the semiconductor chip 10 and the bump electrode 13. As the stress σ increases, cracks tend to develop in the semiconductor chip 10. To lower the stress σ, the bending moment M occurring in the bump electrode 13 must be reduced. To accomplish this, the height h of the bump electrode 13 must be decreased, and the shearing force F occurring at the end 13b of the bump electrode must be decreased. This is in agreement with the result shown in FIG. 4 above. For the junction with the solder, further, the external substrate 16 has been plated with solder to a thickness of about 10 µm. When the height h of the bump electrode is low, therefore, it becomes difficult to accomplish the connection to the external substrate 16. In the diode package 50 of the bare chip type, as shown in FIG. 3, an increased stress tends to build up in the interface between the semiconductor chip 10 and the bump electrode 13 at the time of mounting the chip 10 on the external substrate. As a result, cracks tend to develop in the semiconductor chip 10, and this could become the cause of an electrical defect.

Figure 6:
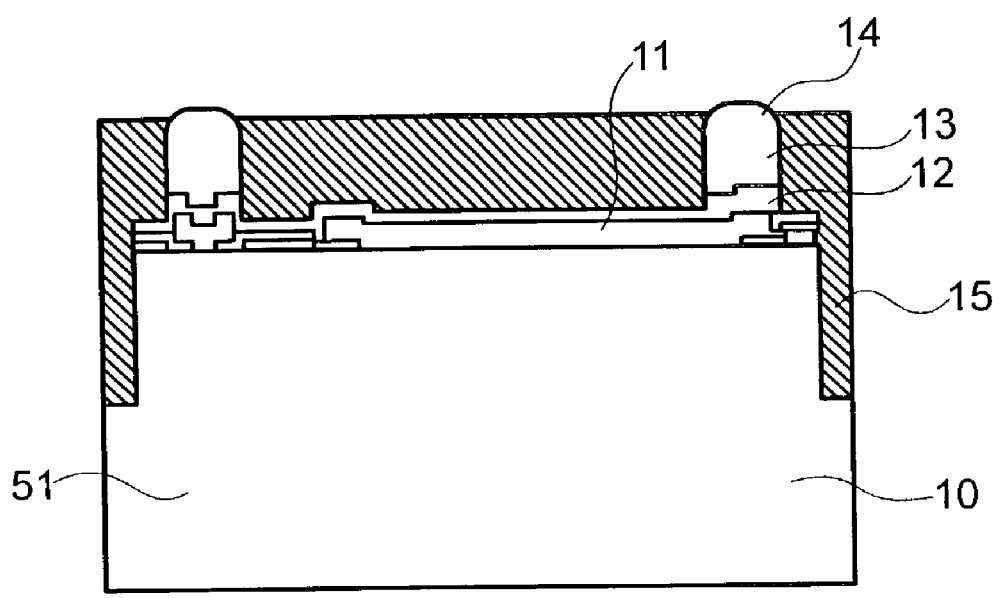
FIG. 6 is a side view of a diode package of the type in which an insulating resin is applied.

FIG. 6 is a view illustrating a diode package 51 having a structure in which the electrode surface and part of the side surfaces of the semiconductor chip 10 are covered with an insulating resin 15. In the device of FIG. 6, when, for example, a polyimide resin is used as the insulating resin 15, nickel is used as the bump electrode 13, since the polyimide resin has a poor resistance against the migration of copper. Further, the polyimide resin must be cured by baking at a high temperature. In this case, nickel is used as the bump electrode 13, and tin is plated as the metal layer 14 for suppressing the oxidation of the bump electrode 13. When gold is plated as the metal layer 14, a mutual diffusion takes place which promotes the oxidation of the bump electrode 13. In the case of the semiconductor chip 10, which has a lateral structure, the electrode is formed in a region spaced about 5 to 20 µm away from the surface where the bump electrode 13 is formed. To protect the electrode on the side surface of the semiconductor chip 10, therefore, a region about 5 to 20 μm away from the surface of the semiconductor chip may be covered with the insulating resin 15.

Figure 7:
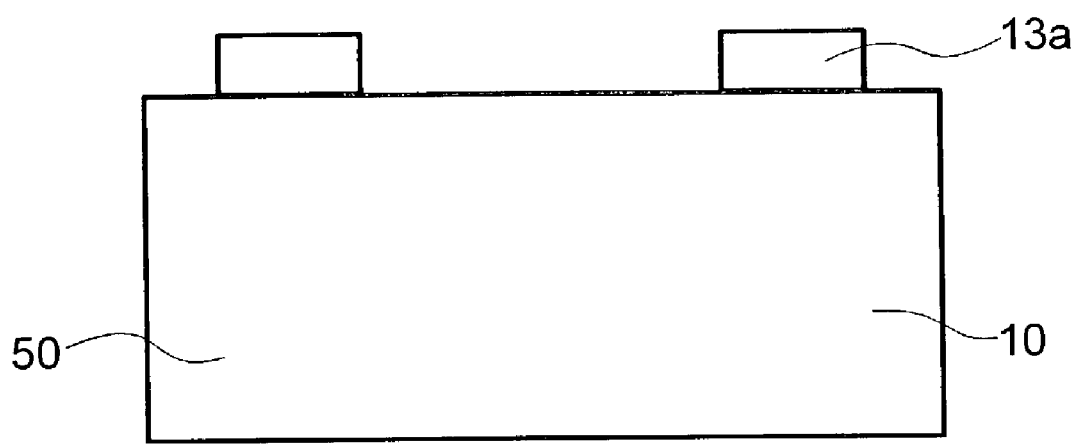
FIG. 7 is a side view schematically illustrating the diode package of the bare chip type.
Figure 8:
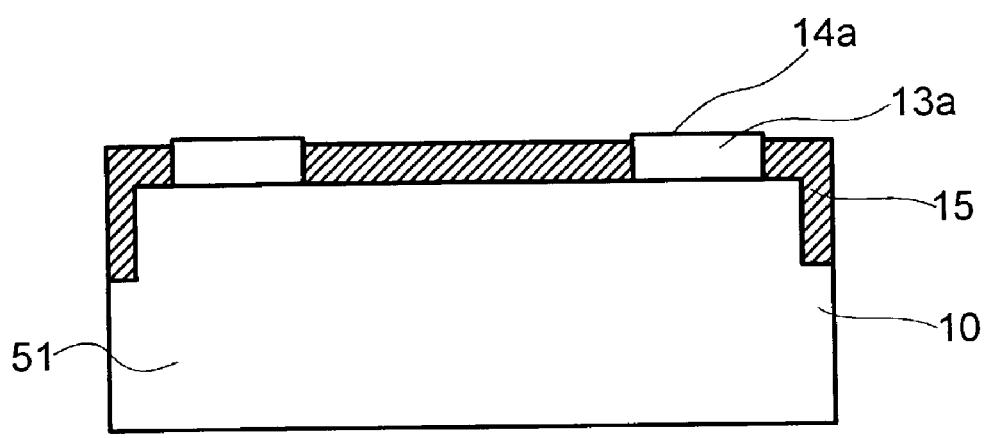
FIG. 8 is a side view schematically illustrating the diode package of the type in which an insulating resin is applied.

FIG. 7 is a diagram schematically illustrating the constitution of a diode package 50 of the bare chip type, and FIG. 8 is a diagram schematically illustrating the constitution of a diode package 51 of the type in which an insulating resin has been applied. In the case of the bare chip type package shown in FIG. 7, the bump electrode 13a needs be connected to an external substrate 16. In the case of the type of package in which an the insulating resin has been applied, as shown in FIG. 8, however, the electrode surface and the side surface of the semiconductor chip 10 are covered with the insulating resin 15, and, hence, the bump electrode 13a also is substantially covered with the insulating resin 15. Accordingly, the portion 14a for connecting the bump electrode 13a to the external substrate 16 must be exposed.

A description will now be provided of cases where the diode packages 50 and 51, having the constitutions shown in FIGS. 7 and 8, are joined to an external substrate with solder.

Figure 9:
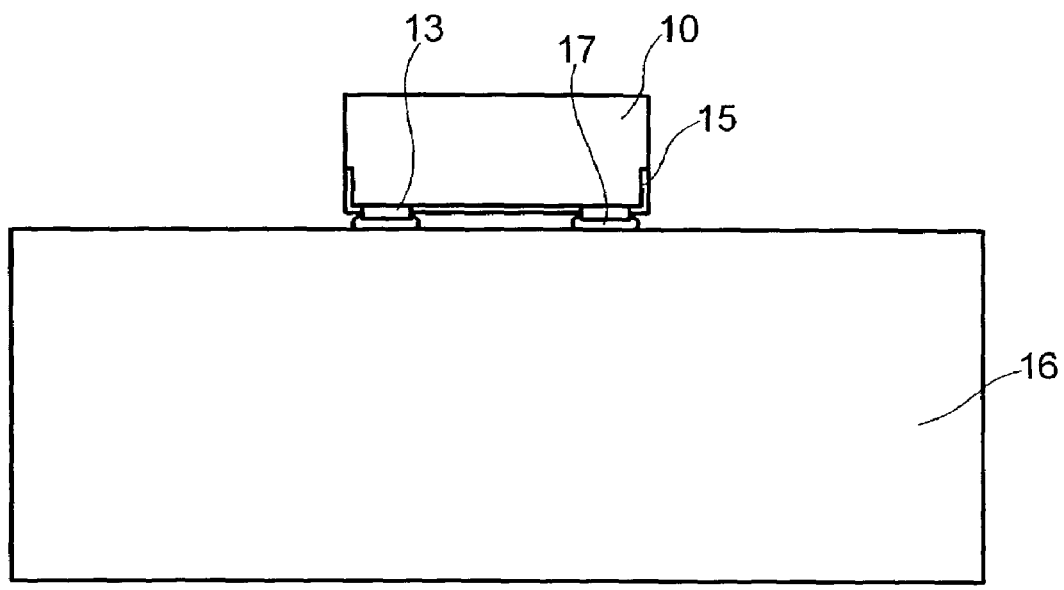
FIG. 9 is a side view showing the diode package, of the type in which an insulating resin is applied, mounted on a substrate.
Figure 10:
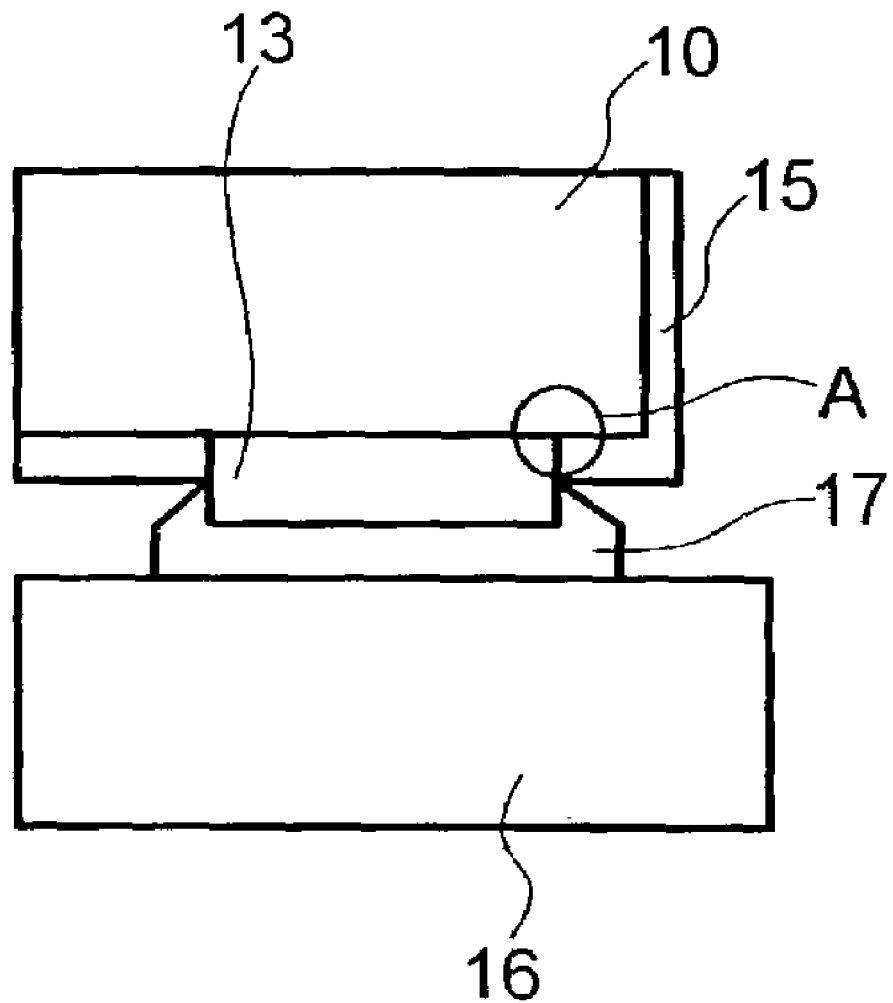
FIG. 10 is a side view illustrating, on an enlarged scale, the vicinity of the bump electrode in the device of FIG. 9.

FIG. 9 is a diagram illustrating a state where the diode package 51, of the type in which an insulating resin is applied, as shown in FIG. 8, is joined to an external substrate 16 with solder; FIG. 10 is a diagram illustrating the constitution of the junction portion on an enlarged scale; and FIGS. 11(a) and 11(b) are graphs illustrating a maximum main stress building up in the interface A between the semiconductor chip 10 and the bump electrode 13 at the junction portion, and the cumulative probability of breakdown in the interface A, respectively, in comparison with the results obtained in the case of the diode package 50 of the bare chip type shown in FIG. 7.

Figure 11:
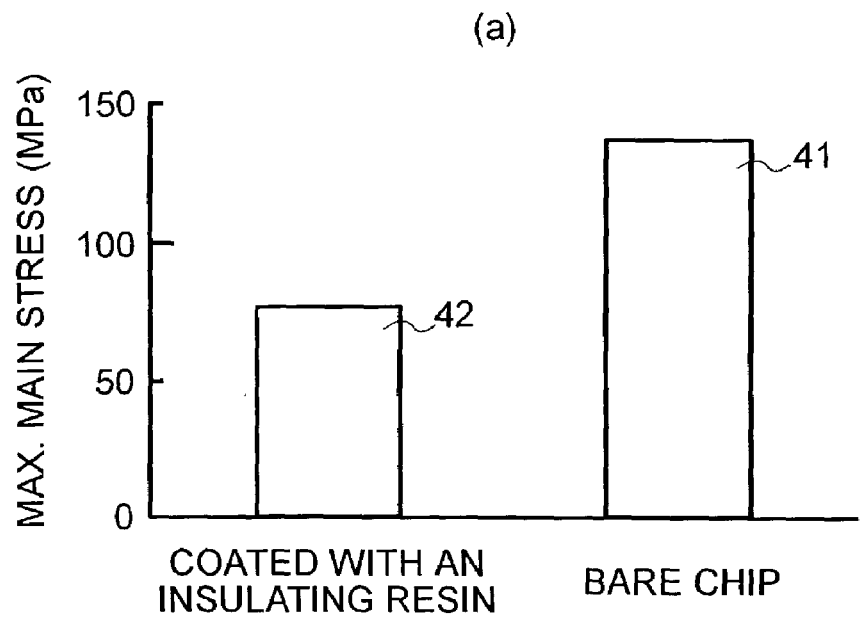
FIGS. 11A, 11B are graphs illustrating a maximum main stress and a cumulative probability of breakdown in the interface between the semiconductor chip and the bump electrode by using the diode packages of the type in which insulating resin is applied and of the bare chip type.
Figure 11:
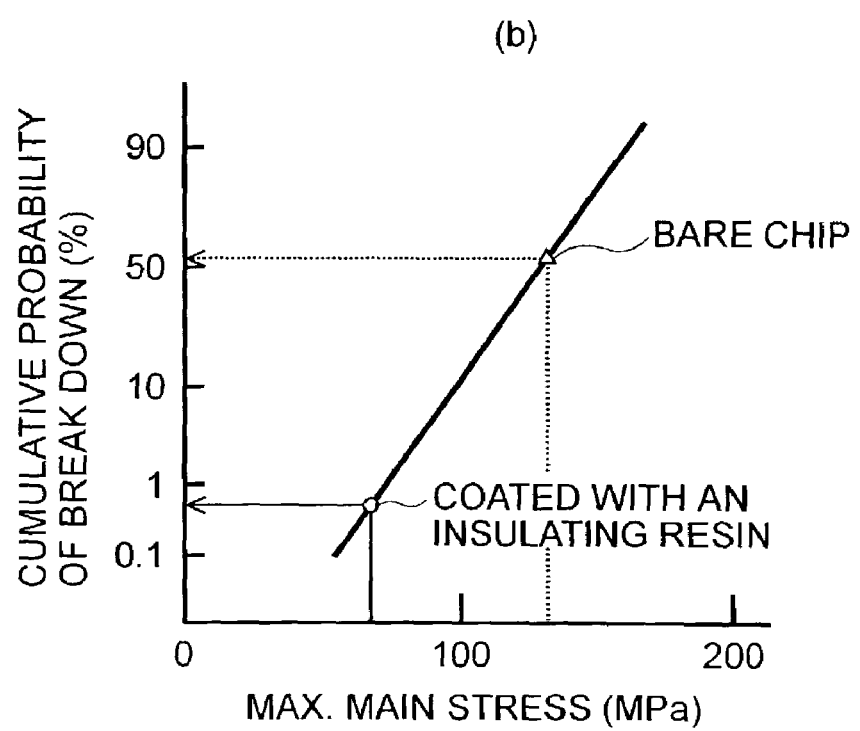

FIG. 11(a) illustrates the results of maximum main stress values in comparison, and FIG. 11(b) illustrates the relationships between the maximum main stress and the cumulative probability of breakdown in comparison. In the case of the small diode 50 of the bare chip type, the maximum main stress is about 130 MPa and the cumulative probability of breakdown is about 50%. In the case of the type of package in which an insulating resin is applied, on the other hand, the maximum main stress is about 78 MPa and the cumulative probability of breakdown is not larger than 1%. The above results prove that, upon covering the semiconductor chip 10 with the insulating resin 15, the stress occurring in the interface between the semiconductor chip 10 and the bump electrode 13 is relaxed to about one-half, and the occurrence of cracks in the semiconductor chip 10 is suppressed to a value smaller than 1/50, thereby guaranteeing a high degree of reliability.

Figure 12:
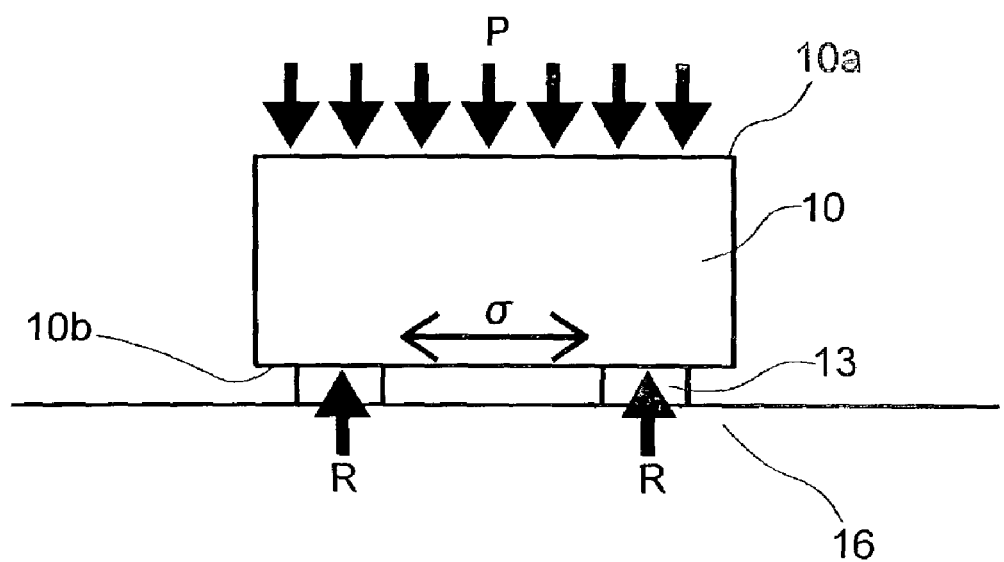
FIG. 12 is a side view schematically illustrating the diode package that is mounted on a substrate.

FIG. 12 is a diagram schematically illustrating the diode package 50 of the bare chip type or the diode package 51 of the type in which an insulating resin is applied, that is mounted on an external substrate 16. At the time of mounting, the mounting load P acts on the back surface 10a of the semiconductor chip 10, and the bump electrode 13 is pushed onto the external substrate 16. At this moment, the bump electrode 13 produces a reaction R, as well as being subjected to a compressive stress. Further, the semiconductor chip 10 deflects with the bump electrode 13 as a fulcrum, and a tensile stress σ is generated on the electrode surface 10b of the semiconductor chip 10.

Figure 13:
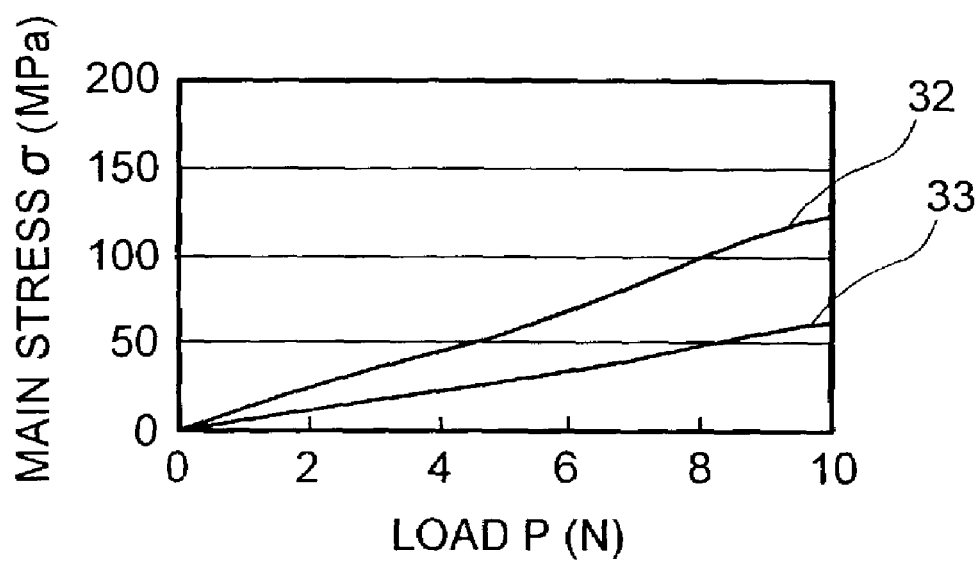
FIG. 13 is a graph illustrating a relationship between a maximum stress in the semiconductor chip and the load on the back surface of the diode package that is mounted on the substrate.

FIG. 13 is a graph illustrating, in comparison, the results of tensile stress σ in the case of the diode package 50 of the bare chip type and in the case of the diode package 51 of the type in which an insulating resin is applied. The stress σ increases with an increase in the load P that is exerted on the back surface 10a of the semiconductor chip 10. As compared to the result 32 of the diode package 50 of the bare chip type, the result 33 of the diode package 51 of the type in which an insulating resin is applied reveals a stress which is decreased by about 50%. Therefore, it is obvious that a high degree of reliability is maintained if the surfaces of the semiconductor chip 10 are covered with the insulating resin 15.

Figure 14:
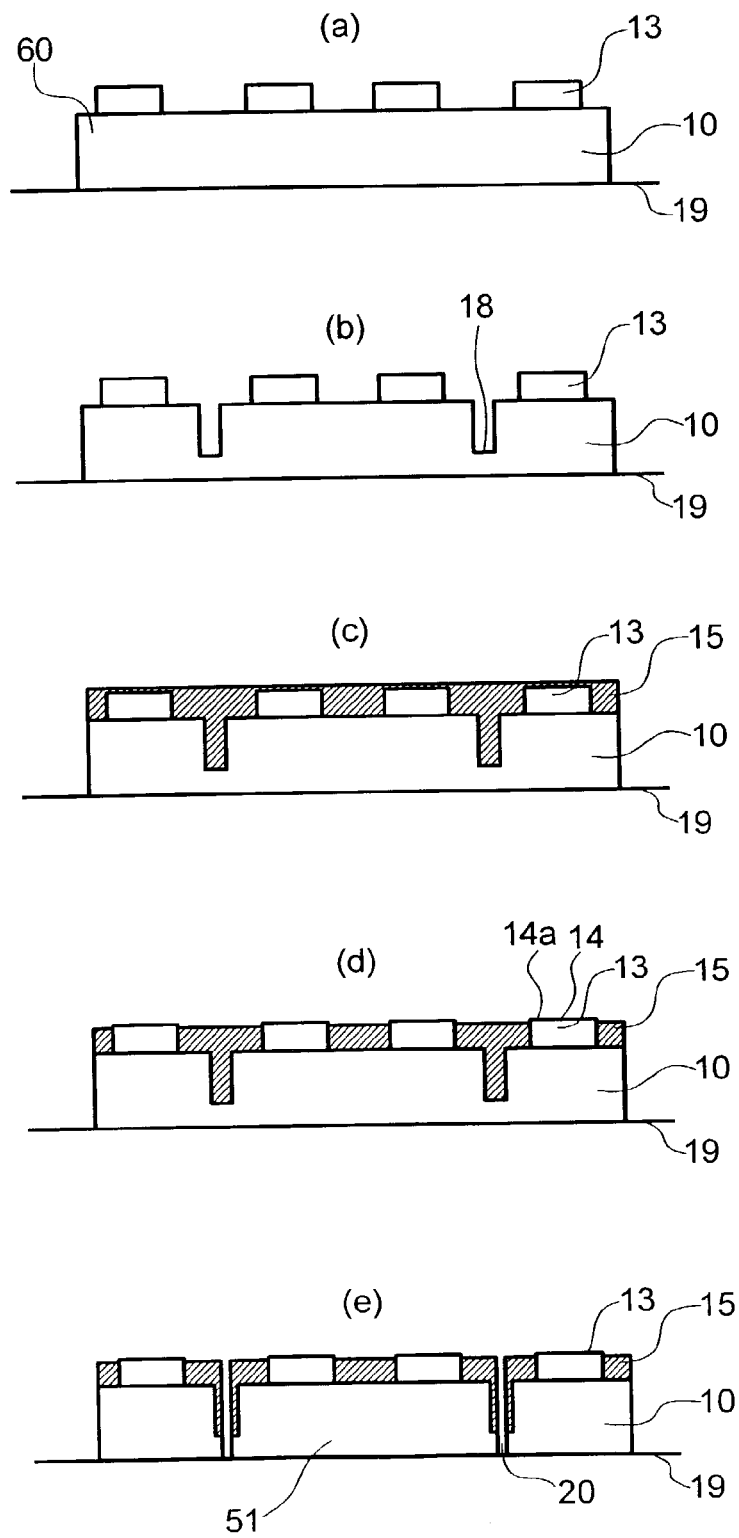
FIGS. 14(a) to 14(e) are diagrammatic side views illustrating a method of manufacturing a diode package of the type in which an insulating resin is applied.

FIGS. 14(a) to 14(e) are diagrams illustrating the steps of a process for manufacturing the diode package 51 of the type in which an insulating resin is applied. In FIG. 14(a), a plurality of semiconductor chips 10 are formed on the semiconductor wafer 60, each having an anode and a cathode on the surface thereof and bump electrodes 13 for electrically connecting the electrodes to the external substrate 16. The surfaces of the semiconductor chips 10, on the side opposite to the surface carrying the electrodes, are secured by using a dicing sheet 19. As for the diode package of, for example, a 0603 size (package length L of about 0.6 mm and a width W of about 0.3 mm), the semiconductor chips 10 are formed in a number of about 40,000 on the 5-inch semiconductor wafer 60. In FIG. 14(b), grooves 18 are formed among the semiconductor chips 10, which grooves are to be filled with an insulating resin 15. The insulating resin 15 to be filled in the grooves 18 serves to insulate and protect the side surfaces of the semiconductor chips 10 and suppresses the peeling of an interface between the insulating resin and the chips during the dicing work. In the case of a semiconductor chip 10 having a lateral structure, the bump electrodes 13 are formed in a region which is deep by about 5 to 20 μm from the surfaces of the electrodes; and, hence, the range for insulating and protecting the electrodes on the side surfaces of the semiconductor chip 10 may be about 5 to 20 μm from the chip surface. Therefore, the region of the depth of a minimum of 5 to 20 μm from the chip surface may be covered with the insulating resin 15. In this embodiment, the grooves 18 in the half-dicing have a depth of about 50 μm and a width of about 40 to 60 μm. The width varies in relation to the number of semiconductor chips 10 obtained from a piece of semiconductor wafer 60.

Referring to FIG. 14(c), the surfaces of the bump electrodes 13 and of the semiconductor chips 10 are covered with the insulating resin 15 for protection, causing the grooves 18 formed in the step shown in FIG. 14(b) to be filled with the insulating resin 15, and the electrode surfaces of the semiconductor chips 10 are also covered with the insulating resin 15. There are many methods of applying the insulating resin. According to the spin-coating method, which involves rotation of the semiconductor wafer 60, the insulating resin 15 is dropped on nearly the central portion of the semiconductor wafer 60. In the initial stage, the semiconductor wafer 60 is rotated at a relatively low speed so that the grooves 18 formed in the step shown in FIG. 14(b) are filled with the insulating resin 15. At the next step, the rotational speed is increased to adjust the thickness of the insulating resin 10 by utilizing centrifugal force.

In addition to the above-described method of application, a vibration system utilizing vibration of ultrasonic waves or of a low frequency, can be employed, for example. According to the vibration system, the insulating resin 15 is dropped on nearly the central portion of the semiconductor wafer 60, and vibration of ultrasonic waves or of a low frequency is imparted to the semiconductor wafer 60 in order to fill the grooves 18 formed in the step shown in FIG. 14(b) with the insulating resin 15 and to spread the insulating resin 15 all over the semiconductor wafer 60. It is also possible to employ a method according to which the width of the grooves 18 is expanded by imparting a tensile force to the semiconductor wafer 60 in two axial directions intersecting each other; the grooves of the expanded width are then filled with the insulating resin 15; and the insulating resin 15 is applied onto the predetermined surface of the semiconductor wafer 60. In a form of this method, the semiconductor wafer is pushed onto the curved surface of another member to expand the width of the grooves by bending the wafer surface, and then the grooves of expanded width are filled with the insulating resin 15, and the insulating resin 15 is applied onto the predetermined surface of the semiconductor wafer 60. The method of expanding the width of the grooves is particularly effective when the grooves 18 formed in the steps shown in FIG. 14(b) are too small in width and cannot be filled with the insulating resin 15 due the viscosity of the insulating resin 15. Further, the grooves 18 may be formed to have such a shape that the width is broadened at the opening portions of the grooves to facilitate their being favorably filled with the insulating resin 15.

Figure 15:
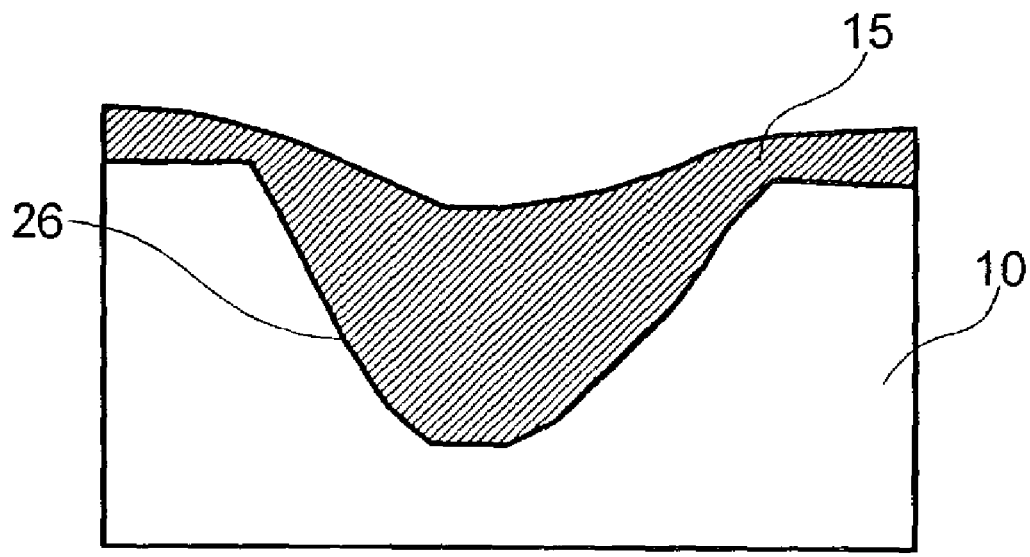
FIG. 15 is a sectional view illustrating a state in which a groove between the semiconductor chips is formed in a V-shape and is filled with an insulating resin.
Figure 16:
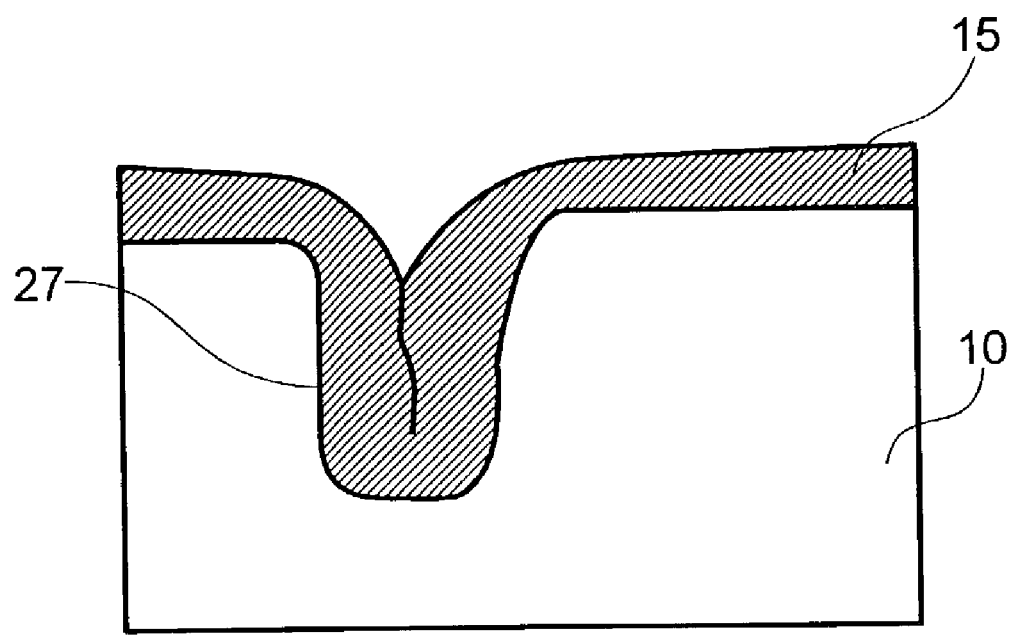
FIG. 16 is a sectional view illustrating a state in which a groove between the semiconductor chips is formed in a parallel shape and is filled with an insulating resin.

FIG. 15 illustrates a state in which the groove is filled with the insulating resin 15 when the opening portions of the grooves are broadened, and FIG. 16 illustrates a state in which the groove is filled with the insulating resin 15 when both side surfaces of the grooves are nearly in parallel and the grooves have nearly an equal width at the opening side and on the bottom side. When the grooves have a narrow width or when the insulating resin 15 has a high viscosity, in particular, an insufficiently filled state tends to occur, as shown in FIG. 16. However, this can be improved by forming the grooves in the shape as shown in FIG. 15.

Referring to FIG. 14(d), the insulating resin 15 is removed from the connection portions 14a to expose the connection portions 14a for connecting the bump electrodes 13 to the external substrate 16. The insulating resin 15, which is a photosensitive polyimide, can be removed by the treatment of exposure to light and developing. After the removal, heat treatment is carried out to thermally cure the insulating resin 15 that has been applied to protect the surfaces and the side surfaces of the semiconductor chips 10. The insulating resin 15, which is, for example, a photosensitive polyimide, is left to stand in an environment of about 350° C. for about one hour. At this time, mutual diffusion may take place depending upon the bump electrodes 13 and the kind of metal plating 14 that is used for preventing oxidation of the bump electrodes 13. The mutual diffusion takes place conspicuously, particularly when the bump electrodes 13 are formed of copper or nickel and when gold is plated, as designated at 14, for preventing the bump electrodes 13 from being oxidized. The mutual diffusion can be prevented by, for example, using tin as the metal plating 14.

Referring to FIG. 14(e), the diode package 51 is separated into individual pieces by cutting among the semiconductor chips through grooves 20 having a width narrower than that of the grooves 18 that have been filled with the insulating resin 15 in the step shown in FIG. 14(c), in such a manner that the insulating resin 15 is left on the side surfaces of the semiconductor chips 10 to protect the side surfaces of the semiconductor chips 10, i.e., in a manner such that the insulating resin 15 in the grooves 18 is left on the side surfaces of the grooves 18. If the grooves 18 formed in the step shown in FIG. 14(b) have a depth of about 50 μm and a width of about 40 to 60 μm, then the grooves 20 may have a width of about 20 to 30 μm. If cutting is effected at one time, chipping may occur at portions of the semiconductor chip 10 that are not covered with the insulating resin 15. It is therefore desired that the cutting is effected through a plurality of notches. The insulating resin 15 and the semiconductor chip 10 have different degrees of hardness. There-fore, the insulating resin 15 may be cut at a first step and the semiconductor chip 10 may be cut at a second step.

Figure 17:
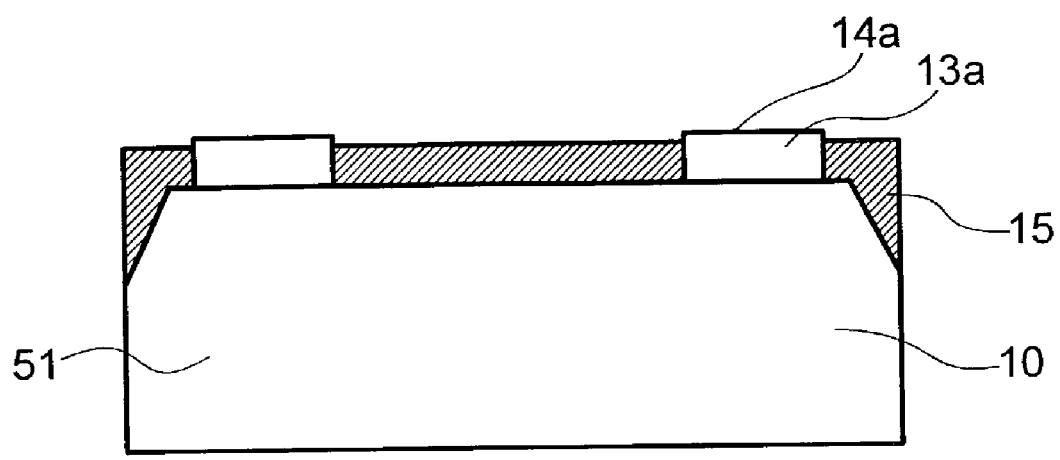
FIG. 17 is a side view schematically illustrating the diode package of the type in which an insulating resin is applied in a groove of the V-shape.

FIG. 17 is a side view schematically illustrating the diode package of the type in which an insulating resin is applied, which package is obtained by forming V-shaped grooves, as shown in FIG. 14(b), applying the insulating resin 15, as shown in FIG. 14(c), and cutting the insulating resin in the grooves, as shown in FIG. 14(e).

Figure 18:
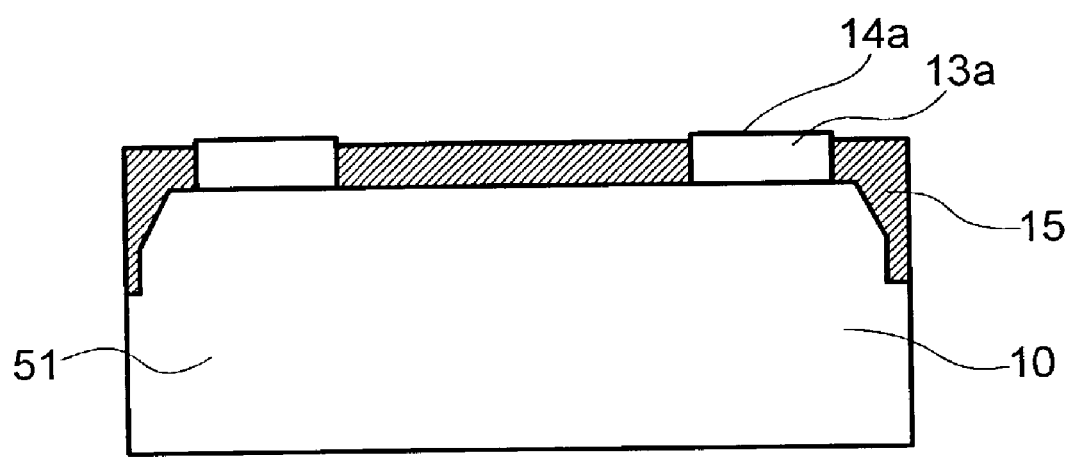
FIG. 18 is a side view schematically illustrating the diode package of the type in which an insulating resin is applied in a groove which is partially of the V-shape and partially of the parallel shape.

FIG. 18 is a side view schematically illustrating the diode package of the type in which an insulating resin is applied, which package is obtained by forming V-shaped grooves extended by grooves of parallel portions in tha manner shown in FIG. 14(b), applying the insulating resin 15 in the manner shown in FIG. 14(c), and cutting the insulating resin in the grooves in the manner shown in FIG. 14(e).

FIGS. 19(a) to 19(e) are diagrams illustrating steps in another manufacturing process according to an embodiment of the present invention. This system is a so-called full dicing system. This system does not require the step of removing the insulating resin 15 for exposing the connection portions 14a only for connecting the bump electrodes 13 of FIG. 14(d) to the external substrate 16. Further, in a diode package 55, nearly the whole surfaces of the semiconductor chips 10 (whole surfaces except for the portions connecting the bump electrodes 13) are covered with the insulating resin 15. Therefore, the semiconductor chips 10 exhibit high reliability even when an unexpected load is exerted thereon.

Figure 19:
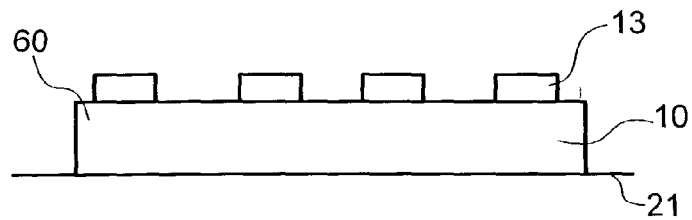
FIGS. 19(a) to 19(e) are side views illustrating another method of manufacturing the diode package of the type in which an insulating resin is applied.
Figure 19:
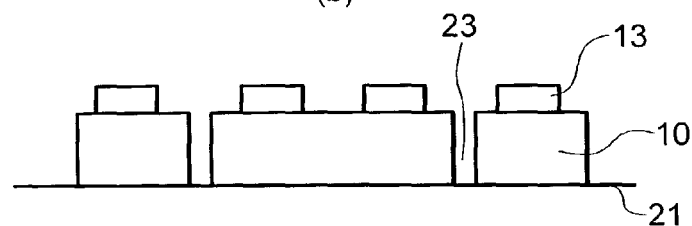
Figure 19:
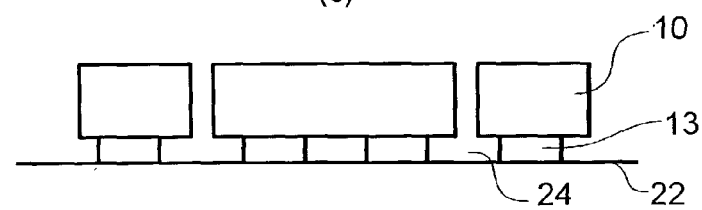
Figure 19:
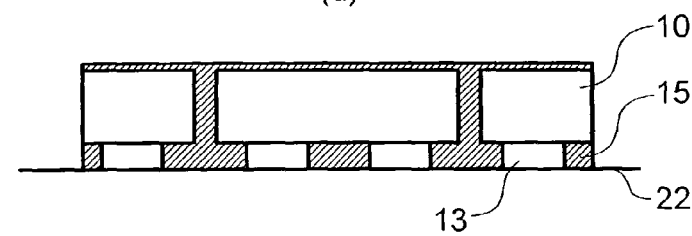
Figure 19:
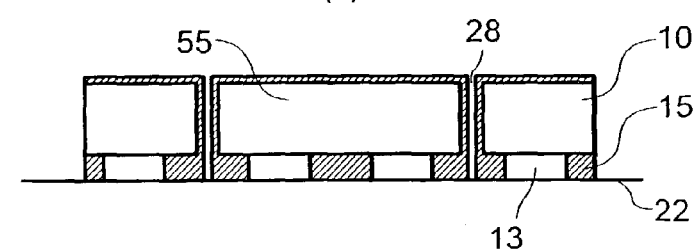

In FIG. 19(a), a plurality of semiconductor chips 10 are formed on the semiconductor wafer 60, each having an anode and a cathode on the surface thereof and bump electrodes 13 for electrically connecting the electrodes to the external substrate 16. The surfaces (back surfaces) of the semiconductor chips 10, on the side opposite to the surfaces carrying the electrodes, are secured by using a first dicing sheet 21.

In FIG. 19(b), grooves 23 are formed among the semiconductor chips 10 in order to separate the semiconductor chips 10. The semiconductor chips 10, after being separated, are secured at their back surfaces by the first dicing sheet 21 and are not scattered.

Referring to FIG. 19(c), onto the bump electrodes 13 on the surfaces of the semiconductor chip 10, a second dicing sheet 22 is mounted having an adhering force greater than that of the first dicing sheet 21 which is used for securing the semiconductor wafer 60, as seen in FIG. 19(b), and the first dicing sheet 21 is then removed by being peeled off the back surfaces of the semiconductor chips 10. Thus, the semiconductor chips 10 are transferred from the surface of the first dicing sheet 21 onto the surface of the second dicing sheet 22. The first dicing sheet 21 needs have an adhering force that does not permit the semiconductor chips 10 to move at the time of forming the grooves 23.

Referring to FIG. 19(d), the surfaces of the semiconductor chips 10, the back surfaces thereof (from where the first dicing sheet 21 is peeled off), the side surfaces thereof, and the side surfaces of the bump electrodes 13 are covered with the insulating resin 15. More specifically, the grooves 23 that are formed as seen in FIG. 19(b) and the voids 24, which are formed by the second dicing sheet 22, by the electrode surfaces of the semiconductor chips 10 and by the bump electrodes 13, are filled with the insulating resin 15, and the back surfaces of the semiconductor chips 10 (from where the first dicing sheet 21 is peeled off) are covered with the insulating resin 15. The method of application may be, for example, a vibration system which applies a vibration of ultrasonic waves or of a low frequency to the semiconductor wafer 60; or, a dipping system may be employed according to which the insulating resin 15 is introduced into a vessel in advance, and the semiconductor wafer 60 and the second dicing sheet 22 are dipped in the vessel. After the insulating resin 15 is applied, the heat treatment is conducted to thermally cure the insulating resin 15. At this time, the second dicing sheet 22 is in a state where it secures the semiconductor chips 10 and the bump electrodes 13, and it must have a resistance against high temperatures.

In FIG. 19(e), the insulating resin 15 after being thermally set is cut in a state where the insulating resin 15 filled in the grooves 23 is partly left on the side surfaces of the grooves 23 to obtain individually divided semiconductor chips 10. After the chips are separated, the second dicing sheet is removed from the side of the end surfaces of the bump electrodes 13.

Figure 20:
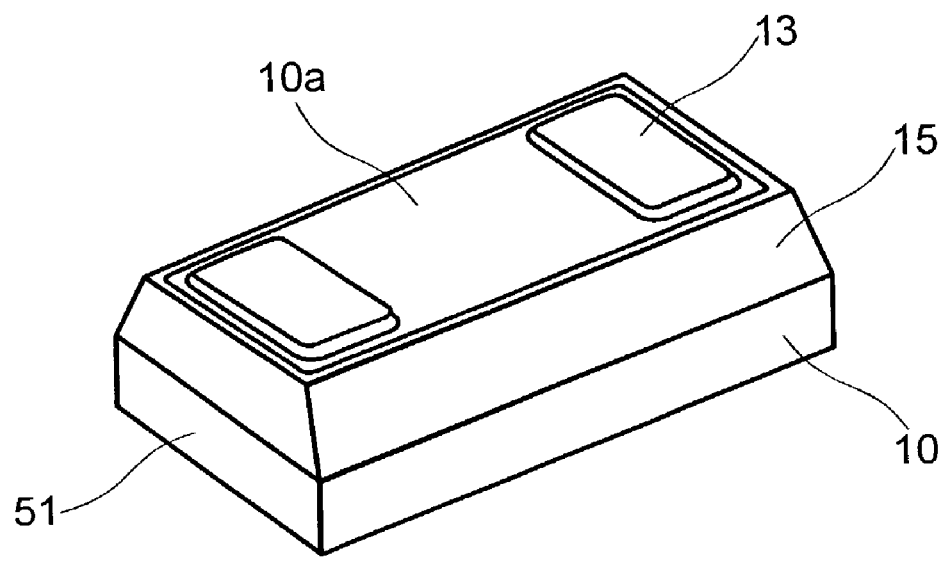
FIG. 20 is a perspective view illustrating the appearance of the diode package of the type in which an insulating resin is applied.

FIG. 20 is a view illustrating the appearance of the diode package 51 of the type in which an insulating resin is applied. The diode package 51 is mounted with its face down on the external substrate 16.

The above-described embodiment is capable of providing a small diode package. Since the insulating resin is provided on the electrode surfaces of the semiconductor chips, stress is relaxed in the interface between the semiconductor chips and the bump electrodes, thereby suppressing the occurrence of cracks. It is also possible to decrease the number of manufacturing steps. Since no wire connection is employed, the connection operation is easy and reliability is improved. The insulating resin is applied in the state of the semiconductor wafer, facilitating the application operation and requiring a decreased period of time. The cost can be decreased, as well.

The features of the invention as described in the claims and illustrated with reference to the above-described embodiment are (1) a method of manufacturing a semiconductor package by forming grooves among the semiconductor chips, the grooves having a depth of not larger than about 50 μm and a width of from about 40 μm to about 100 μm, (2) a method of manufacturing a semiconductor package by forming grooves among the semiconductor chips, the grooves being tapered in cross section on the opening side and having parallel side surfaces on the bottom side, (3) a method of manufacturing a semiconductor package by applying an insulating resin and filling the grooves with the insulating resin in a state where the width of the grooves is expanded among the semiconductor chips by imparting tensile force to the semiconductor wafer in the two axial directions on the wafer surface in a step of applying the insulating resin for protection, and (4) a method of manufacturing a semiconductor package by applying an insulating resin onto the surface of the semiconductor wafer and filling the grooves with the insulating resin in a state where the semiconductor wafer is pushed onto a curved surface to expand the width of the grooves among the semiconductor chips in a step of applying the insulating resin for protection.

The above-described embodiment has dealt with a diode package serving as a semiconductor package having two electrodes, including an anode and a cathode. Not being limited thereto only, however, the invention may deal with any semiconductor package in addition to a diode package.

According to the present invention, there is provided a small diode package capable of suppressing the occurrence of cracks and exhibiting improved reliability. It is further possible to decrease the number of steps in the manufacturing process, facilitating the operation for connecting the electrodes and for applying the insulating resin. The cost can be decreased as well.

What is claimed is:

1. A diode package having an anode and a cathode, comprising:
   a semiconductor chip which is tapered on the side surfaces thereof and has two electrodes in the form of an anode and a cathode, which are arranged in spaced relationship on one surface of the chip, so that an electric current flows across the two electrodes along said one surface of the chip;
   bump electrodes formed on the two electrodes so as to connect the electrodes to an external substrate; and
   an insulating resin applied onto said one surface of the chip where the anode and the cathode are formed and onto surrounding side surfaces of the chip, wherein in the insulating resin is formed from grooves, which have a V-shaped opening portion which opens on said one surface of the chip and which overlies a portion having sides parallel to side surfaces of the chip, said grooves being formed between a plurality of the semiconductor chips on a semiconductor wafer before dicing the wafer into individual chips, wherein:
   the one surface of each of the chips are covered with the insulating resin and the grooves are filled with the insulating resin;
   the insulating resin is removed from connection portions of the bump electrodes to expose the connection portions of the bump electrodes; and
   a plurality of the diode packages are formed by separating the wafer into individual pieces by cutting among the semiconductor chips through the grooves in a manner that the insulating resin is left on the one surface of each of the chips and on the side surfaces of the semiconductor chips with a portion of the insulating resin being formed along a tapered portion of the side surfaces and a portion of the insulating resin being formed in indented portions of the side surfaces, under the tapered portions, wherein the indented portions have indented side surfaces which are parallel to unindented portions of the side surfaces underlying both the tapered portions and the indented portions of the side surfaces.

2. A diode package according to claim 1, wherein the bump electrodes are formed in nearly a rectangular parallelepiped shape.

3. A diode package according to claim 1, wherein the bump electrodes are arranged side by side in the lengthwise direction of the package.

4. A diode package according to claim 1, wherein the bump electrodes are comprised of a first plated layer and a second plated layer to prevent the oxidation of the first plated layer.

5. A diode package according to claim 4, wherein the second plated layer is a tin-plated layer.

6. A diode package according to claim 1, wherein the diode package is a lateral structure diode package.

* * * * *